United States Patent
Kaya et al.

(10) Patent No.: US 7,812,371 B2
(45) Date of Patent: Oct. 12, 2010

(54) GAN BASED SEMICONDUCTOR ELEMENT

(75) Inventors: Shusuke Kaya, Tokyo (JP); Seikoh Yoshida, Tokyo (JP); Masatoshi Ikeda, legal representative, Tokyo (JP); Sadahiro Kato, Tokyo (JP); Takehiko Nomura, Tokyo (JP); Nariaki Ikeda, Tokyo (JP); Masayuki Iwami, Tokyo (JP); Yoshihiro Sato, Tokyo (JP); Hiroshi Kambayashi, Tokyo (JP); Yuki Niiyama, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/382,010

(22) Filed: Mar. 5, 2009

(65) Prior Publication Data

US 2009/0278172 A1    Nov. 12, 2009

(30) Foreign Application Priority Data

Mar. 7, 2008    (JP)    ............................. 2008-057344

(51) Int. Cl.
*H01L 31/072* (2006.01)

(52) U.S. Cl. ........................ 257/192; 257/76; 257/190; 257/213

(58) Field of Classification Search ................. 257/192, 257/76, 190, 213
See application file for complete search history.

(56) References Cited

FOREIGN PATENT DOCUMENTS

WO    WO-03-071607    8/2003

*Primary Examiner*—Long Pham
(74) *Attorney, Agent, or Firm*—Kubotera & Associates LLC

(57) ABSTRACT

The field effect transistor includes a laminated structure in which a buffer layer, and an electron transporting layer (un-doped GaN layer), and an electron supplying layer (undoped AlGaN layer) are laminated in sequence on a sapphire substrate. An npn laminated structure is formed on a source region of the electron supplying layer, and a source electrode is formed on the npn laminated structure. A drain electrode is formed in a drain region of the electron supplying layer, and an insulating film is formed in an opening region formed in the gate region. When a forward voltage greater than a threshold is applied to the gate electrode, an inversion layer is formed and the drain current flows. By changing a thickness and an impurity concentration of the p-type GaN layer, the threshold voltage can be controlled. The electrical field concentration between the gate electrode and the drain electrode is relaxed due to the drift layer, and voltage resistance improves.

12 Claims, 7 Drawing Sheets

GAN BASED SEMICONDUCTOR ELEMENT

CROSS-REFERENCE TO RELATED APPLICATIONS

This application claims priority from a Japanese patent application serial No. 2008-057344 filed on May 7, 2008, the entire content of which is incorporated herein by the reference.

BACKGROUND OF THE INVENTION

1. Field of the Invention

The present invention relates to a GaN based semiconductor element such as a GaN based field effect transistor.

2. Description of the Related Art

Since GaN based semiconductor elements have large band-gap energy and are superior in a high temperature operation due to a high degree of heat resistance, developments of field effect transistors (FET) that use those materials, in particular, GaN/AlGaN based semiconductor, are undergoing.

As conventional GaN based field effect transistors, for example, a technique disclosed in Patent Document is known in the art. The GaN based field effect transistor is comprised of: a source electrode and a drain electrode; a channel region comprising a first GaN based semiconductor material which is i-GaN based semiconductor material or p-GaN based semiconductor material, formed to electrically connect the source electrode and the drain electrode; a first electrode supply region and a second electrode supply region spaced apart from each other, comprising a second GaN based semiconductor material which has larger band-gap energy than the first GaN based semiconductor material, and jointed with the channel region; an insulating layer formed on a surface of the channel region which locates between the first and second electrode supply region; and a gate electrode formed on the insulating layer. According to the conventional technique, a GaN based field effect transistor is obtained with normally-off type, which has low on-resistance and is capable of operating with large electronic current.

Patent Reference: No. WO 03/071607

In the conventional normally-off type GaN based field effect transistor described above, it is difficult to control a threshold, and the threshold ranges from 0 V to +1 V.

SUMMARY OF THE INVENTION

It is an object of the present invention to at least partially solve the problems in the conventional technology.

According to an aspect of the invention, a GaN based semiconductor element includes a semiconductor layer with electrical conductivity formed of a GaN based semiconductor; a npn laminated structure disposed on one part of the semiconductor layer and formed of the GaN based semiconductor; a source electrode formed on the npn laminated structure; a drain electrode formed on the semiconductor layer; an insulating film formed on at least a sidewall region of the npn laminated structure and a part of the semiconductor layer; and a gate electrode formed on the insulating film.

With the configuration described above, when the gate is opened wherein a forward voltage greater than or equal to a threshold is not applied to the gate electrode, an inversion layer is not formed in a p-type GaN layer of the npn laminated structure, and an inversion layer is not formed in the semiconductor layer with electrical conductivity directly under the gate electrode. Therefore, a drain current does not flow when the gate is opened. When a forward voltage greater than or equal to the threshold is applied to the gate electrode, an inversion layer is formed to provide a channel at the sidewall portion of the npn laminated structure, so that the drain current flows. Thus, the GaN based semiconductor element that effectively becomes normally-off is obtained.

Furthermore, by changing a thickness and an impurity concentration of the p-type GaN layer of the npn laminated structure, the threshold voltage can be easily controlled. Thus, the GaN based semiconductor element that effectively becomes normally-off is obtained, in which the threshold reliably increases to a positive value while maintaining a low on-resistance.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
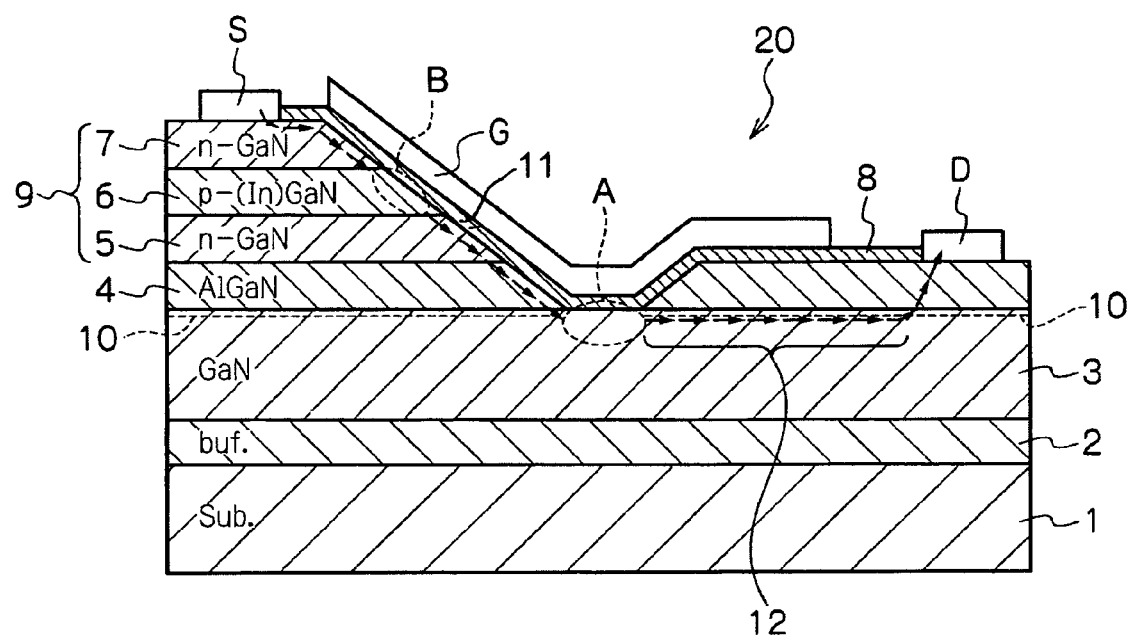
FIG. 1 is a cross-sectional view showing a field effect transistor according to the first embodiment of the invention.

Embodiments of the invention will be described referring to the drawings. In the below description of the embodiments of the invention, similar parts are assigned similar numbers so as to omit duplicate descriptions.

First Embodiment

A GaN based semiconductor element (field effect transistor: FET) 20 according to a first embodiment of the invention will be described referring to FIG. 1.

In the field effect transistor 20, a layered structure (heterojunction structure) formed by laminating a buffer layer 2 comprised of, e.g., AlN layer, an undoped GaN layer (electron transporting layer 3), and an electron supplying layer (undoped AlGaN layer) 4, sequentially on a sapphire (0001) substrate 1. The buffer layer 2 may be constructed as a laminated structure of AlN and GaN.

At a surface of the electron transporting layer (undoped GaN layer) 3, the electron supplying layer (undoped AlGaN layer) 4 is forming a hetero-junction, and thereby, a two-dimensional electron gas layer 10 is formed at a boundary surface of the junction region. Therefore, the two-dimensional electron gas layer 10 functions as a carrier so that the electron transporting layer 3 exhibits electrical conductivity.

In other words, at the AlGaN/GaN hetero-junction surface, negative electrical charge (electron) accumulates at the electron transporting layer (undoped GaN layer) 3 side due to spontaneous polarization and piezoelectric effect. Without doping impurities in the AlGaN layer, the accumulated electrons form high concentration two-dimensional electron gas at the GaN layer directly under the hetero-junction boundary, and therefore, they are advantageous in lowering the resistance of the channel, i.e., on-resistance of the field effect transistor 20.

Thus, due to the electron transporting layer (undoped GaN layer) 3 comprised of a first GaN based semiconductor material (undoped GaN), and to the electron supplying layer (undoped AlGaN layer) 4 comprised of a second GaN based semiconductor material (undoped AlGaN) that has band-gap energy greater than that of the first GaN based semiconductor material, electrically-conductive semiconductor layer comprised of GaN based semiconductor is constructed.

On a part of the electron supplying layer 4 (a region that corresponds to the source), n-type GaN layer (n-type layer) 5, p-type GaN layer (p-type layer) 6, and n-type GaN layer (n-type layer) 7 are laminated sequentially from the electron supplying layer 4. With these n-type GaN layer 5, p-type GaN layer 6 and n-type GaN layer 7, an npn laminated structure (first npn laminated structure) 9 is constructed. On the npn laminated structure 9, a source electrode S that is electrically connected to the n-type GaN layer 7 is formed. At a region of the electron supplying layer 4 that corresponds to the drain, a drain electrode D that is electrically connected to the electron supplying layer 4 is formed.

At an area between a region that corresponds to the source and a region that corresponds to the drain in the electron supplying layer 4, an opening region 11 with depth that reaches to the electron transporting layer 3 is formed by etching. An insulating film 8 is formed in at least the opening region 11 of the electron supplying layer 4, a sidewall region of the npn laminated structure 9, and a part on the electron supplying layer 4 (a part on the semiconductor layer). In the present embodiment of the invention, the insulating film 8 is formed so that it covers a surface of the n-type GaN layer 7, and an inner surface of the opening region 11 of the npn laminated structure 9 and a surface of the electron supplying layer 4.

In the field effect transistor 20 constructed as such, if a forward voltage greater than or equal to a threshold is applied to the gate electrode G, first, an inversion layer (inverted distribution layer) B is formed at the p-type GaN layer 6 of the npn laminated structure 9 and a channel is formed.

Furthermore, in the field effect transistor 20, an AlGaN layer is opened in a region directly under the gate electrode G of the electron transporting layer (undoped GaN layer) 3 and the hetero-junction is not formed in the region, and thereby, the two-dimension electron gas layer 10 is not formed (is split) in this region. If a forward voltage greater than or equal to the threshold is applied to the gate electrode G, an inversion layer (inverted distribution layer) A is formed in the electron transporting layer (undoped GaN layer) 3 directly under the gate electrode G. The inversion layer A is connected to the two-dimension electron gas layer 10 (drift layer 12) between the gate electrode G and the drain electrode.

The field effect transistor 20 constructed as such can be manufactured in the following process. An MOCVD (Metal Organic Chemical Vapor Deposition) device was used as a growth device and a sapphire (0001) substrate 1 was used for the substrate.

First, the sapphire (0001) substrate 1 was introduced into the MOCVD device, and inside of the MOCVD device was vacuumed by a turbo pump until the degree of vacuum became less than or equal to $1\times10^{-6}$ hPa, and thereafter, the degree of vacuum is made to 100 hPa and the temperature of the substrate 1 was increased to 600° C. After the temperature was stabilized, tri-methyl-aluminum (TMA) and ammonia, which are raw materials, were introduced into the surface of the substrate 1 with flow rates, 100 cm$^3$/min and 12 liter/min, respectively, and the buffer layer 2 comprised of AlN was grown (refer to FIG. 2(A)). The film thickness of the buffer layer 2 is about 50 nm.

Figure 2A:
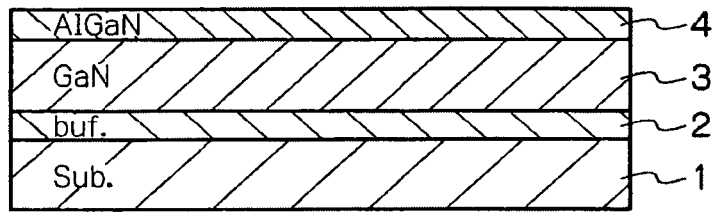
FIGS. 2(A)-2(D) are illustrative diagrams showing steps for manufacturing the field effect transistor according to the first embodiment of the invention.
Figure 2A:

Thereafter, the temperature was increased while ammonia was being flowed with the flow rate 12 liter/min, and after the temperature was held at 1050° C., tri-methyl-gallium (TMG) and ammonia were introduced onto the buffer layer 2 with flow rates, 300 cm$^3$/min and 12 liter/min, respectively, so as to grow the electron transporting layer 3 comprised of GaN layer (refer to FIG. 2(A)). The film thickness of the electron transporting layer 3 was 3000 nm.

Then, tri-methyl-aluminum (TMA), tri-methyl-gallium (TMG), and ammonia were introduced with the flow rates, 50 cm$^3$/min, 100 cm$^3$/min, and 12 liter/min, respectively, to grow the electron supplying layer 4 comprised of $Al_{0.25}Ga_{0.75}N$ layer (refer to FIG. 2(A)). The film thickness of the electron supplying layer 4 is 20 nm.

Figure 2B:
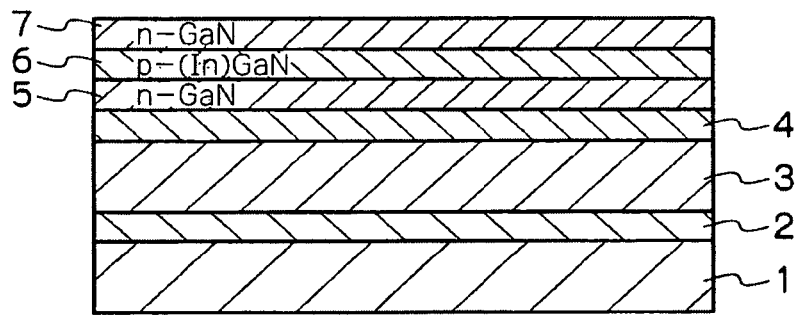

Thereafter, similarly, n-type GaN layer 5 with 100 nm thickness, p-type GaN layer 6 with 500 nm thickness, and n-type GaN layer 7 with 100 nm thickness was laminated in sequence, and a layered structure shown in FIG. 2(B) was completed. The impurity concentration of the n-type GaN layer 5 is $1\times10^{19}$ cm$^{-3}$, the impurity concentration (Mg concentration) of the p-type GaN layer 6 is $5\times10^{19}$ cm$^{-3}$, and the impurity concentration of the n-type GaN layer 7 is $1\times10^{19}$ cm$^{-3}$.

Figure 2C:
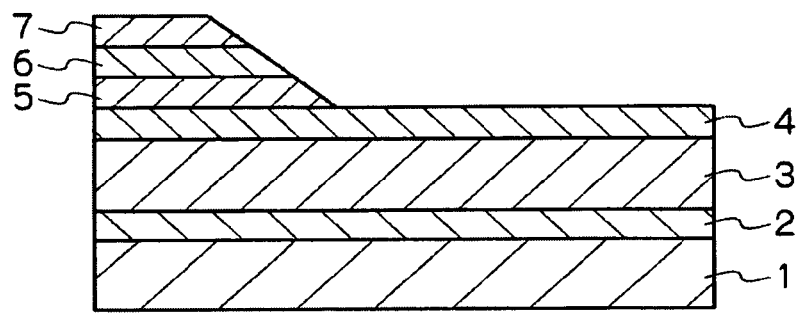
Figure 2C:
Figure 2D:
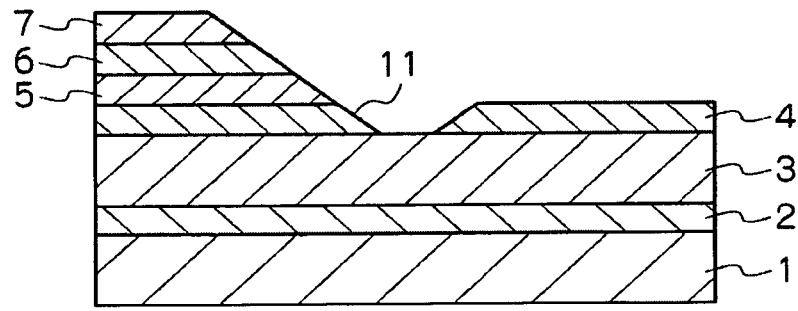

Then, the regions that form the gate and the drain are dry-etched using chloride-based gas. This dry-etching is performed in two rounds. At the first one, as shown FIG. 2(C), the n-type GaN layer 7, the p-type GaN layer 6 and the n-type GaN layer 5 are dry-etched to the depth that reaches to the electron supplying layer 4 wherein the region that forms the source is left no etched. Then, as shown in FIG. 2(D), the region that corresponds to the gate of the electron supplying layer 4 is dry-etched to the depth that reaches to the electron transporting layer 3.

Figure 3A:
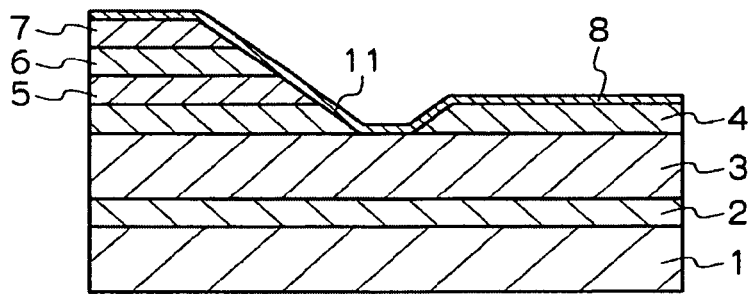
FIGS. 3(A)-3(D) are illustrative diagrams showing steps for manufacturing following the steps in FIGS. 2(A)-2(D).
Figure 3B:
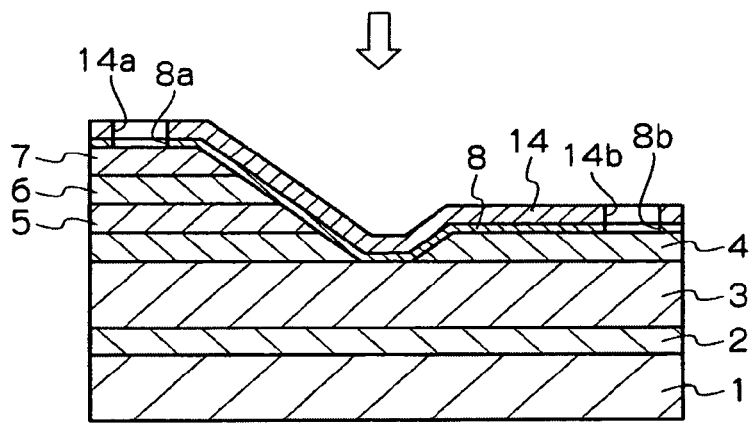

Thereafter, the insulating film 8 comprised of SiO$_2$ with 50 nm thickness is formed, which becomes the gate insulating film (FIG. 3(A)). Then, SiO$_2$ film 14 is deposited on the whole surface, the patterning is performed, and openings 8a, 14a and openings 8b, 14b are constructed at regions where the source electrode S and the drain electrode D should be formed, respectively, so that the surface of the n-GaN layer 7 and the surface of the electron supplying layer 4 are exposed (refer to FIG. 3(B)).

Figure 3C:
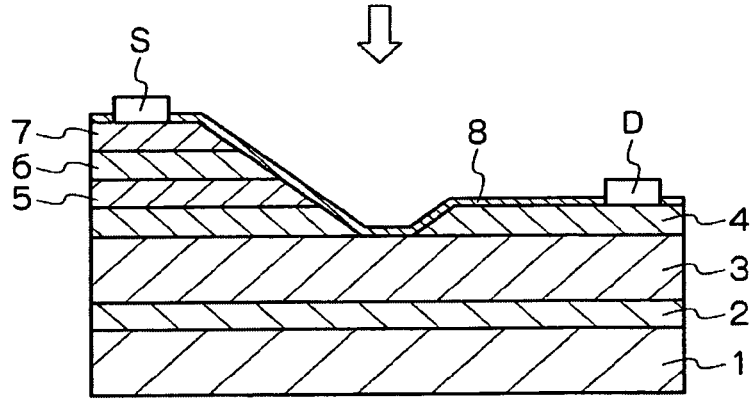
Figure 3D:
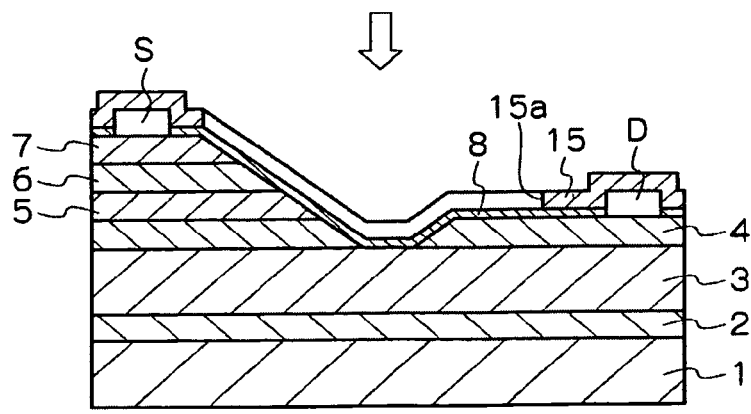

On these surfaces, alloy films of Ti, Al and Si, and W (tungsten) are deposited in sequence to form the source electrode S and the drain electrode D, and thereafter, the SiO$_2$ film 14 is removed (refer FIG. 3(c)). Then, SiO$_2$ film 15 is deposited on the whole surface again, the patterning is performed so that the regions above the source electrode S and the drain electrode D are covered and an opening 15a is provided in the region where the gate is to be formed (refer to FIG. 3(D)). At this region, Ti and Au were deposited in sequence to form the gate electrode G. Thereafter, SiO$_2$ film 15 was removed, and thus, the field effect transistor 20 shown FIG. 1 is manufactured.

In the following, operations of the field effect transistor 20 manufactured as above will be described.

When the gate is opened wherein a forward voltage greater than or equal to a threshold is not applied to the gate electrode G, the inversion layer B is not formed in the p-type GaN layer 6 of the npn laminated structure 9, and a channel is not formed in the npn laminated structure 9. Furthermore, the inversion layer A is not formed in the electron transporting layer 3 directly under the gate electrode G. Therefore, the drain current does not flow when the gate is opened.

Meanwhile, if a voltage greater than or equal to the threshold is applied to the gate electrode G, first, the inversion layer B is formed in the p-type GaN layer 6 of the npn laminated structure 9, and the channel is formed in the npn laminated structure 9. Then, the inversion layer A is formed in the electron transporting layer 3 directly under the gate electrode G. Because this inversion layer A is connected to the two-dimension electron gas layer 10 (drift layer 12) between the gate electrode G and the drain electron, the channel in the electron transporting layer 3 is formed.

Thereby, as shown with allows in FIG. 1, the electrons that are supplied form the source electrode S to the n-type GaN layer 7 of the npn laminated structure 9 transit in the channel that is formed in the npn laminated structure 9, and transit to the drain electrode D side via the electron supplying layer 4, the inversion layer A and the drift layer 12, and they go into the drain electrode D via the electron supplying layer 4 directly under the drain electrode D. Thus, electric current flows between the source and the drain. Consequently, the operation of the normally-off type field effect transistor 20 is achieved.

Regarding the threshold voltage of the field effect transistor 20, the threshold voltage can be controlled by changing the thickness of the p-type GaN layer 6 of the npn laminated structure 9 or by changing its impurity concentration. Specifically, the thicker the p-type GaN layer 6, the higher the threshold voltage can be made, and the higher the impurity concentration of the p-type GaN layer 6, the higher the threshold voltage can be made.

Furthermore, the threshold voltage of the field effect transistor 20 can be controlled by adjusting the balance of impurity concentrations for each of the n-type GaN layer 5, the p-type GaN layer 6 and the n-type GaN layer 7 of the npn laminated structure 9.

According to the first embodiment of the invention constructed as above, the following functions and advantageous effects are achieved. When the gate is opened wherein the forward voltage greater than or equal to a threshold is not applied to the gate electrode G, the inversion layer A and the inversion layer B are not formed and the current does not flow between the source and the drain as described above. Meanwhile, if a forward voltage greater than or equal to the threshold is applied to the gate electrode G, the inversion layer A and the inversion layer B are formed, and thereby, the current flows between the source and the drain as described above. Thus, the GaN field effect transistor that effectively becomes normally-off can be obtained.

Moreover, the threshold voltage can be easily controlled by changing the thickness or impurity concentrations of the p-type GaN layer 6 of the npn laminated structure 9, or by adjusting the balance of impurity concentrations for each of the n-type GaN layer 5, the p-type (In) GaN layer 6, and the n-type GaN layer 7. Therefore, the threshold is reliably increased to a positive value while maintaining a small on-resistance, and thereby, the GaN based field effect transistor that effectively becomes normally-off can be obtained.

Since the drift layer 12 is formed with the two-dimensional electron gas layer 10 at a region between the gate electrode G and the drain electrode D, the electrical field concentration between the gate electrode G and the drain electrode D is relaxed and the voltage resistance is improved. Thus, the threshold is reliably increased to a positive value while achieving small on-resistance and high voltage resistance, and thereby, the GaN based field effect transistor that effectively becomes normally-off can be obtained.

Since the high concentration two-dimensional electron gas layer 10 is formed on the surface of the electron transporting layer 3, the channel resistance, i.e., the on-resistance of the field effect transistor 20, can be made small.

Second Embodiment

Figure 4:
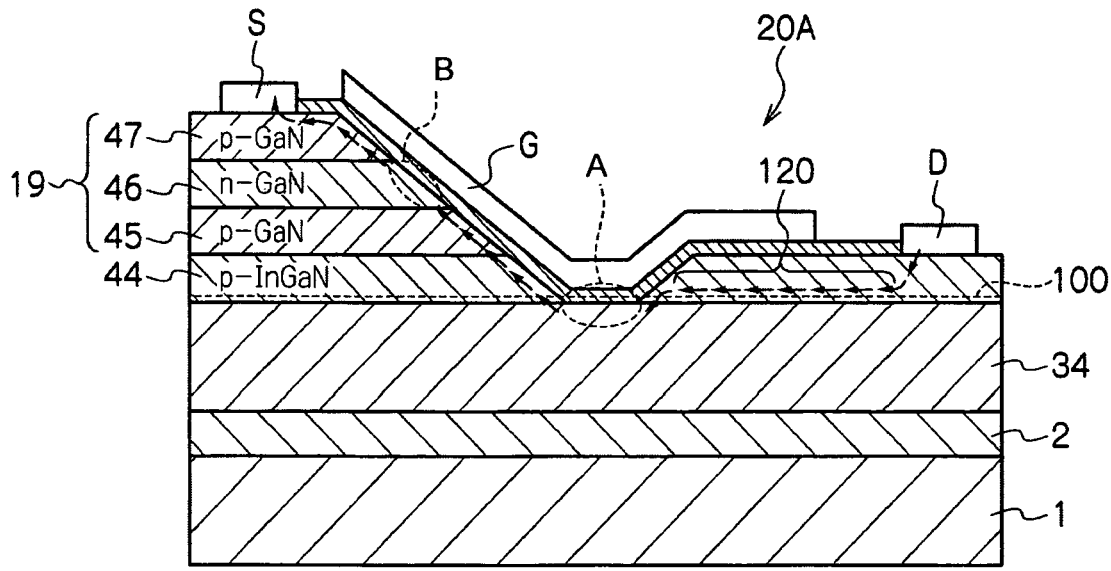
FIG. 4 is a cross-sectional view showing a field effect transistor according to a second embodiment of the invention.

FIG. 4 shows a GaN based semiconductor element (field effect transistor) 20A according to a second embodiment of the invention. In the field effect transistors 20A, a buffer layer 2, and an electron supplying layer 34 comprised of undoped GaN, and an electron transporting layer 44 comprised of p-type InGaN are formed on the substrate 1, sequentially. At a region on the electron transporting layer 44 that corresponds to the source, p-type GaN layer 45, n-type GaN layer 46 and p-type GaN layer 47 are laminated sequentially in this order, and a pnp laminated structure 19 is constructed.

A source electrode S is formed on the p-type GaN layer 47, and the drain electrode D is formed on the electron transporting layer 44. At a region of the electron transporting layer 44 that corresponds to the gate, the opening 11 that extends to the electron supplying layer 34 is provided.

Since the electron transporting layer 44 and the undoped GaN layer 34 are forming a hetero-junction, a two-dimensional portion gas layer 100 is formed at an interface of the junction region. Therefore, the two-dimensional hole gas layer 100 functions as a carrier and the electron transporting layer 44 becomes electrically-conductive.

If a voltage smaller than or equal to a threshold is applied to the gate electrode G, the inversion layer (inverted distribution layer) B is formed in the n-type GaN layer 46 of the pnp laminated structure 19 and a channel is formed in the pnp laminated structure 19. Since a region directly under the gate electrode G of the undoped GaN layer 34 forms a boundary surface with the insulating film 8, if a voltage greater than or equal to the threshold is applied to the gate electrode G in a backward direction, an inversion layer (inverted distribution layer) A is formed in the undoped GaN layer 34 directly under the gate electrode G. The inversion layer A is connected the two-dimensional portion gas layer 100 (drift layer 120) that locates between the gate electrode G and the drain electrode D.

Third Embodiment

Figure 5:
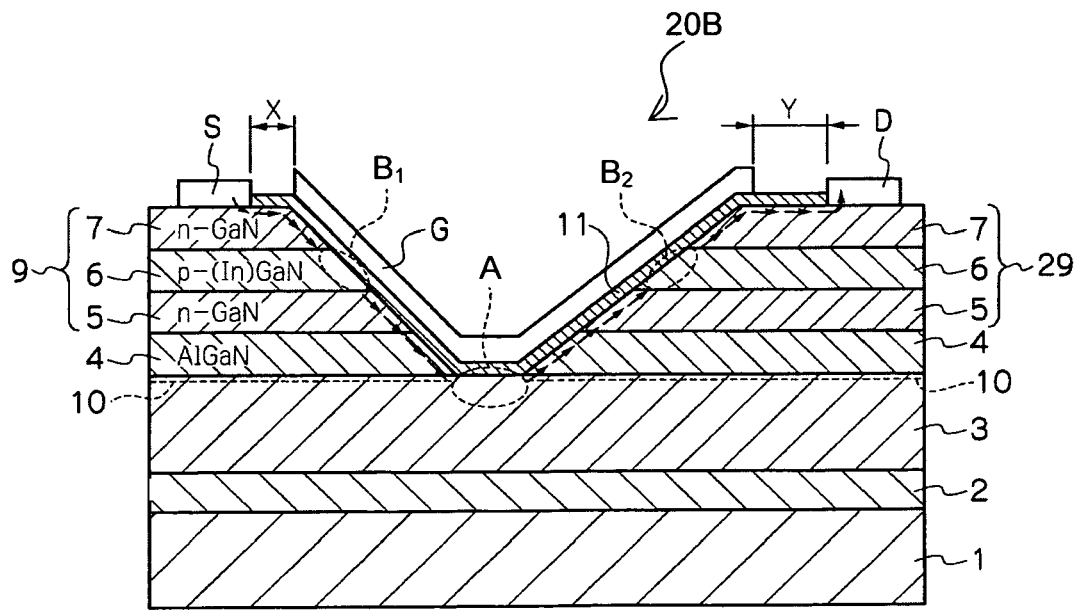
FIG. 5 is a cross-sectional view showing a field effect transistor according to a third embodiment of the invention.

FIG. 5 shows a field effect transistor 20B according to a third embodiment of the invention.

In the field effect transistor 20 according to the first embodiment of the invention, n-type GaN layer 5, p-type GaN layer 6 and n-type GaN layer 7 are laminated in this order from the electron supplying layer 4 at a region on the electron supplying layer 4 that corresponds to the drain also. A second npn laminated structure 29 is constructed by these n-type GaN layer 5, p-type GaN layer 6 and n-type GaN layer 7. On the second npn laminated structure 29, the source electrode S that electrically connects to the n-type GaN layer 7 is formed. It is noted that, in this field effect transistor 20B, the spacing X between the source electrode S and one end of the gate electrode G is made smaller than a spacing Y between the drain electrode D and another end of the gate electrode G.

If a forward voltage greater than or equal to a threshold is applied to the gate electrode G, inversion layers B1, B2 are formed in each p-type GaN layer 6 of the npn laminated structure 9, 29 so as to form a channel in the npn laminated structure 9, 29, and also, the inversion layer A is formed in the electron transporting layer 3 directly under the gate electrode G. These channels are connected to the inversion layer A that is formed in the electron transporting layer 3 directly under the gate electrode G.

Thereby, as shown with allows in FIG. 5, the electrons supplied from the source electrode S transit in the channel that is formed in the npn laminated structure 9, and run through the electron supplying layer 4 and the inversion layer A, and after running through the electron supplying layer 4, they transit in a channel that is formed in the sidewall portion of the opening of the npn laminated structure 29 and enter into the drain electrode D. Thus, the current flows between the source and the drain. Accordingly, the operation of a normally-off-type field effect transistor can be achieved.

Forth Embodiment

Figure 6:
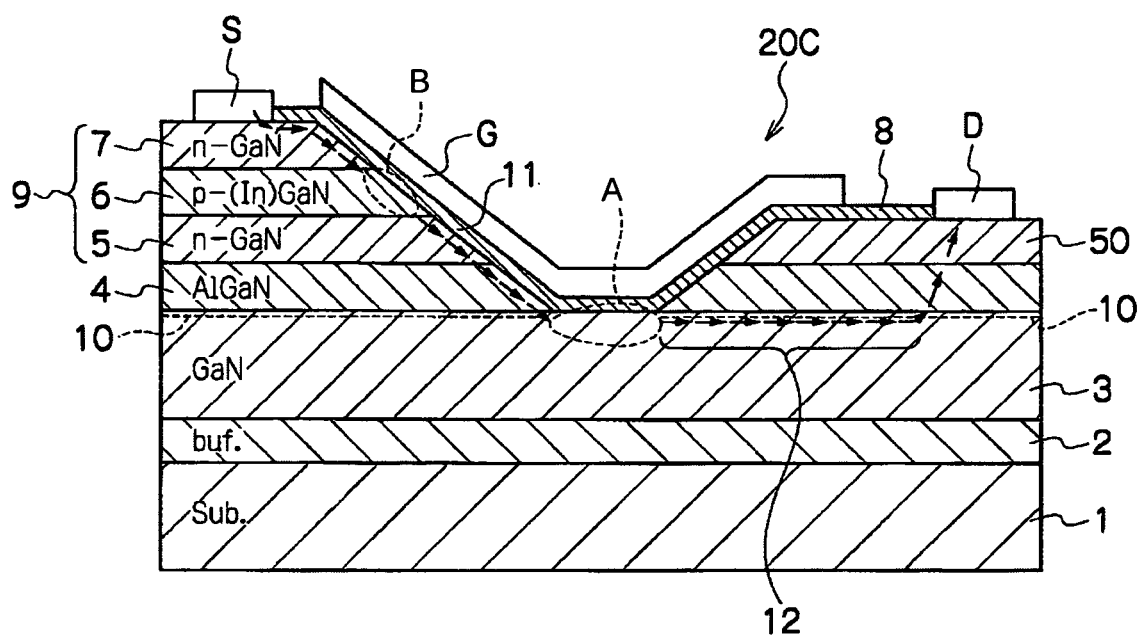
FIG. 6 is a cross-sectional view showing a field effect transistor according to a forth embodiment of the invention.

FIG. 6 shows a field effect transistor 20C according to a forth embodiment of the invention.

In the field effect transistor 20 according to the first embodiment of the invention shown in FIG. 1, the above-described semiconductor layer is comprised of a buffer layer formed on the substrate 1, the electron transporting layer 3 comprised of p-type GaN based compound semiconductor, and the electron supplying layer 4 formed in the electron transporting layer 3 and is comprised of GaN based compound semiconductor having band-gap energy greater than that of the electron transporting layer 3.

The npn laminated structure 9 is formed in a region on the electron supplying layer 4 that corresponds to the source, and a surface layer 50 comprised of GaN based compound semiconductor having band-gap energy small than that of the electron supplying layer 4 is formed in a region on the electron supplying layer 4 that corresponds to the drain.

The insulating film 8 is formed on the inner surface of the opening region 11 that forms a recess region having the surface of the electron transporting layer 3 exposed by removing a part of the npn laminated structure 9, the surface layer 50, and the electron supplying layer 4, as a bottom surface, and on the surface layer 50. Other structures are similar to the field effect transistor 20 according to the above first embodiment of the invention.

According to the field effect transistor 20C of the forth embodiment of the invention, the following functions and advantageous effects are achieved in addition to those of the above first embodiment of the invention On the electron supplying layer 4, the surface layer 50 comprised of the GaN based compound semiconductor having band-gap energy smaller than that of the GaN based semiconductor of the electron supplying layer 4 is formed, and the insulating film 8 is formed on the surface layer 50. Therefore, the boundary surface level density is decreased compared with a case where the insulating film is directly formed on the electron supplying layer 4, and the occurrence of the current collapse can be suppressed. Accordingly, a field effect transistor having a high pressure resistance and low on-resistance, and is not easily affected by the changes in characteristics due to the electric current collapse is achieved.

Fifth Embodiment

Figure 7:
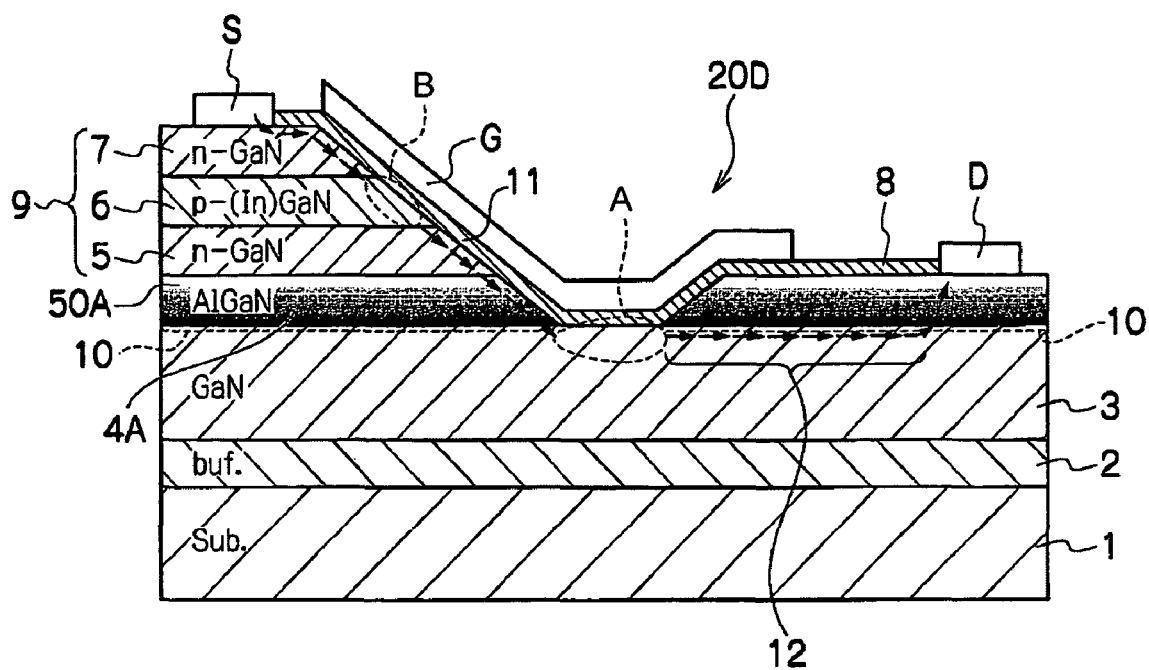
FIG. 7 is a cross-sectional view showing a field effect transistor according to a fifth embodiment of the invention.

FIG. 7 shows a field effect transistor 20D according to a fifth embodiment of the invention.

In the above field effect transistor 20 according to the first embodiment of the invention shown FIG. 1, an electron supplying layer 4A is used instead of the electron supplying layer 4. This electron supplying layer 4A consists of $Al_zGa_{1-z}N$ ($0 \leqq z < 1$), wherein Al composition ratio z decreases as it approaches to the surface side, and becomes a surface layer 50A comprised of undoped or n-type GaN at a location closest to the surface of the electron supplying layer 4A. In other words, the electron supplying layer 4A is comprised of AlGaN having Al composition ratio that decreases gradually form the substrate 1 side, and the surface side of the electron supplying layer 4A also functions as the surface layer 50A.

The Al composition ratio of the electron supplying layer 4A is preferably 15-25% at the substrate 1 side and 0-15% at the surface side. The electron supplying layer 4A can be obtained by adjusting the flow amount of the raw material gas during the growth, specifically, by decreasing the flow amount of the TMA with passage of time. Other structures are similar to the field effect transistor 20 according to the above first embodiment of the invention.

By constructing as such, the electron supplying layer 406 configures a hetero-junction structure with the drift layer at the substrate 406 side and generates the two-dimensional electron gas layer, and the boundary surface level density with the insulating film (gate insulating film 411) at the surface side is reduced by also functioning as a surface layer.

Sixth Embodiment

Figure 8:
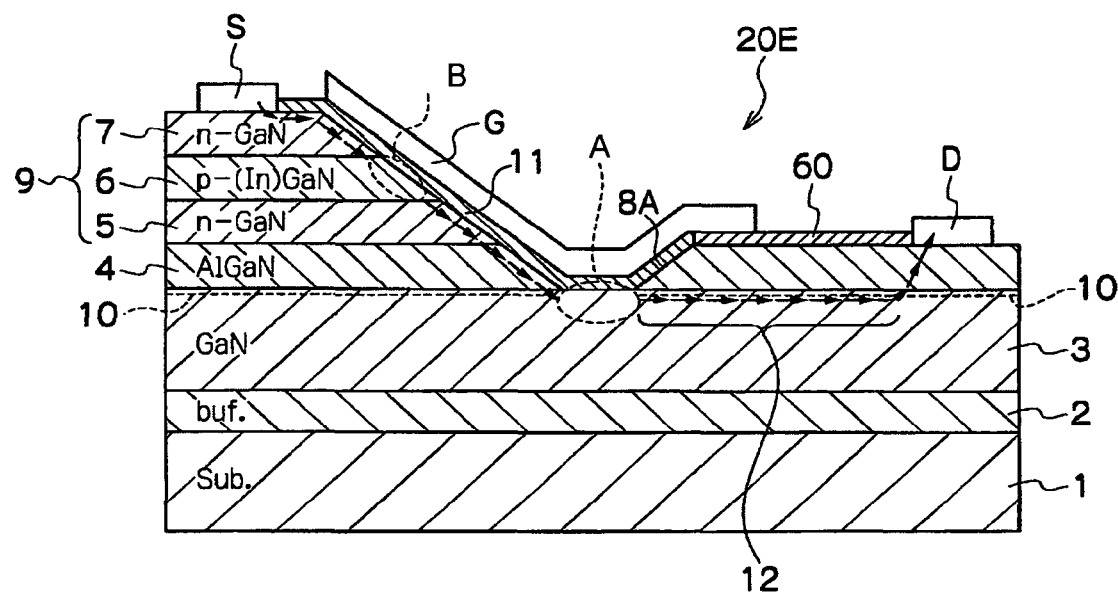
FIG. 8 is a cross-sectional view showing a field effect transistor according to a sixth embodiment of the invention.

FIG. 8 shows a field effect transistor 20E according to a sixth embodiment of the invention.

As shown in FIG. 1, in the field effect transistor 20 according to the above first embodiment of the invention, the above-described semiconductor layer is comprised of the electron transporting layer 3 comprising p-type GaN based compound semiconductor material formed on the substrate 1, and an electron supplying layer 4 is formed in the electron transporting layer 3 and is comprised of GaN based compound semiconductor having band-gap energy greater than that of the electron transporting layer 3.

In the field effect transistor 20E, a first insulating film 8A, instead of the insulating film 8, is formed on an inner surface of the opening region 11, which is a recess region having a surface of the electron transporting layer 3 that is exposed by removing a part of the npn laminated structure 9 and the electron supplying layer 4, as a bottom surface.

A second insulating film 60 that is a different insulating film than the first insulating film 8A and that has current collapse decreasing effect, is formed at a region on the surface of the electron supplying layer 4 that corresponds to the drain.

The first insulating film 8A is comprised of a film that has insulation breakdown endurance pressure greater than that of the second insulating film 60.

In accordance with this structure, since the second insulating film 60 that has current collapse decreasing effect is formed in a region on the surface of the electron supplying layer 4 that corresponds to the drain, the boundary surface level decreases and the current collapse advantageously reduces.

Furthermore, by using a material having a large insulation breakdown endurance pressure such as $SiO_2$ and $Al_2O_3$, as the first insulating film 8A, the gate endurance pressure advantageously improves. In each of the above embodiments of the invention, a layer constructed by the hetero-junction of the undoped GaN layer (the electron transporting layer 3) and the undoped AlGaN layer (the electron supplying layer 4) is used for the electrically-conductive GaN based semiconductor layer, and the two-dimensional electron gas layer 10 is generated directly under the hetero-junction boundary so that the electron transporting layer 3 becomes electrically-conductive. However, the electron transporting layer is not limited to the hetero-junction structure of the undoped GaN layer (the electron transporting layer 3) and the undoped AlGaN layer (the electron supplying layer 4), and can be any GaN based semiconductor layer that is electrically-conductive. For example, the electron transporting layer 3 may be constructed with p-type GaN based compound semiconductor material.

For example, in the above embodiments of the invention, Mg doped p-type GaN based semiconductor layer that is electrically-conductive may be formed on the buffer layer 2 and this GaN based semiconductor layer may be used as the electron transporting layer. It is noted that Be, C, or Zn may be used for the p-type impurity instead of Mg. In this case, n-type GaN layer is formed as the drift layer, in a region between the gate electrode G and the drain electrode D.

According to such a structure, since n-type GaN layer is formed in the region between the gate electrode G and the drain electrode as the drift layer, the electrical field concentration between the gate electrode G and the drain electrode D is relaxed and the endurance pressure improves. Therefore, similar with the first embodiment of the invention, a GaN based field effect transistor is achieved, that increases the threshold reliably to a positive value and that effectively becomes normally-off, while achieving also a small on-resistance and high endurance pressure.

In the above embodiments of the invention, a substrate such as SiC substrate, Si substrate, GaN substrate, MgO substrate, ZnO substrate, diamond substrate, SOI substrate, etc., can be used instead of a sapphire substrate. In the above embodiments of the invention, a field effect transistor is manufactured on the substrate but the present invention is applicable to a field effect transistor in which the substrate is removed, e.g., by etching, i.e., to a field effect transistor with no substrate.

In the above embodiments of the invention, the semiconductor material that forms the electron transporting layer 3, the n-type GaN layer, and the p-type GaN layer is not limited to a single crystal GaN, but GaN based compound semiconductor may be used also. Furthermore, the semiconductor material that forms the p-type GaN layer 6 is not limited to GaN, but GaN based compound semiconductor such as InGaN, may be used also. Moreover, the electron supplying layer 4 is not limited to AlGaN but other GaN based compound semiconductor, e.g., InAlN, may be used also. The material of insulating film 8 in the above embodiments of the invention is not limited to $SiO_2$, but may be any material that has insulation characteristics and adhesion characteristics with each of the semiconductor layers that forms an interface with the insulating film 8. For example, SiN, SiON, $Al_2O_3$, AlN, $HfO_2$, etc., may be used as the material for the insulating film 8. Furthermore, the insulating film 8 is not limited to a single layer such as a $SiO_2$ insulating film, but may be configured as a plurality of layer, such as $SiO_2$/SiN.

In the above embodiments of the invention, an example that has MOS structure is described, but needless to say, the present invention is applicable to structures such as HEMT structure, a diode and a bipolar transistor that use GaN.

The present invention is applicable to a field effect transistor that has a structure in which the surface layer 50 comprising GaN based compound semiconductor material in the field effect transistor 20C according to the forth embodiments of the invention as shown in FIG. 6, is replaced with a layer comprising AlGaN, and the Al composition ratio of the surface layer 50 is smaller than that of the electron supplying layer 4 comprising AlGaN. In other words, this field effect transistor has a surface layer consisted of $Al_xGa_{1-x}N$, and an electron supplying layer consisted of $Al_yGa_{1-y}N$ (wherein x<y) In order to obtain such an electron supplying layer 3, the electron supplying layer 4 comprising AlGaN with Al composition 25% is epitaxially grown on the drift layer 12, and the surface layer comprising AlGaN with Al composition 5% is epitaxially grown on the electron supplying layer 4.

By using AlGaN that has Al composition ratio smaller than that of the electron supplying layer as the surface layer, the boundary surface level between the surface layer and the insulating film (gate insulating film) 8 is decreased and the current collapse is advantageously reduced. The Al composition ratio of AlGaN that is used for the surface layer is preferably greater than 0% and less than or equal to 15%.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein said forth.

What is claimed is:

1. A GaN based semiconductor element, comprising:
   a semiconductor layer with electrical conductivity formed of a GaN based semiconductor;
   a first npn laminated structure disposed on one part of the semiconductor layer and formed of the GaN based semiconductor;
   a source electrode formed on the first npn laminated structure;
   a drain electrode formed on the semiconductor layer;
   an insulating film formed on at least a sidewall region of the first npn laminated structure and another part of the semiconductor layer; and
   a gate electrode formed on the insulating film.

2. The GaN based semiconductor element according to claim 1, wherein said semiconductor layer has a hetero-junction structure including an electron transporting layer formed of a first GaN based semiconductor and an electron supplying layer formed on the electron transporting layer and formed of a second GaN based semiconductor having a band-gap energy greater than that of the first GaN based semiconductor.

3. The GaN based semiconductor element according to claim 2, wherein said electron supplying layer includes an opening region having a depth reaching the electron transporting layer at a part of the another part, said gate electrode being formed in the opening region through the insulating film.

4. The GaN based semiconductor element according to claim 1, wherein said semiconductor layer includes an electron transporting layer formed of a p-type or undoped GaN based semiconductor and a drift layer formed on the electron transporting layer and formed of an n-type GaN based semiconductor.

5. The GaN based semiconductor element according to claim 1, further comprising a second npn laminated structure on the semiconductor layer in a region corresponding to a drain, said second npn laminated structure being formed of an n-type layer, a p-type layer, and an n-type layer sequentially laminated from a side of the semiconductor layer, said drain electrode being disposed on the second npn laminated structure, said insulating film covering the sidewall region of the first npn laminated structure, the semiconductor layer in a region corresponding to a gate, and a sidewall region of the second npn laminated structure.

6. The GaN based semiconductor element according to claim 3, further comprising a surface layer formed on the electron supplying layer in a region corresponding to a drain, said surface layer being formed of a GaN based semiconductor having a band-gap energy smaller than that of the electron supplying layer, said insulating film being formed on an inner surface of a recess region having a bottom surface formed of the sidewall region of the laminated structure, the surface layer, and a part of the electron transporting layer removed and exposed.

7. The GaN based semiconductor element according to claim 2, further comprising a drift layer between the electron supplying layer and the electron transporting layer, said drift layer being formed of a p-type or undoped GaN based compound semiconductor material having a band-gap energy smaller than that of the electron supplying layer and an impurity concentration smaller than that of the electron transporting layer.

8. The GaN based semiconductor element according to claim 6, wherein said surface layer is formed of an n-type or undoped GaN.

9. The GaN based semiconductor element according to claim 6, wherein said surface layer is formed of $Al_xGa_{1-x}N$, and said electron supplying layer is formed of $Al_yGa_{1-y}N$ (wherein $x<y$).

10. The GaN based semiconductor element according to claim 8, wherein said electron supply layer is formed of $Al_zGa_{1-z}N$ ($0 \leq z < 1$), in which a composition ratio z of Al decreases toward a surface side, said surface layer being formed on a surface of the electron supplying layer.

11. The GaN based semiconductor element according to claim 1, wherein said semiconductor layer includes an electron transporting layer formed of a p-type GaN based compound semiconductor material formed on a substrate and an electron supplying layer formed on the electron transporting layer and formed of a GaN based compound semiconductor material having a band-gap energy greater than that of the electron transporting layer, said laminated structure being formed on the electron supplying layer in a region corresponding to a source, said insulating film including a first insulating film formed on an inner surface of a recess region having a bottom surface formed of the laminated structure and a part of the electron transporting layer removed and exposed, and a second insulating film formed on a surface of the electron supplying layer in a region corresponding to the drain.

12. The GaN based semiconductor element according to claim 11, wherein said first insulating film is formed of a material having a breakdown voltage greater than that of the second insulating film.

* * * * *